US010630180B2

(12) United States Patent
Shiji et al.

(10) Patent No.: US 10,630,180 B2
(45) Date of Patent: Apr. 21, 2020

(54) POWER SUPPLY APPARATUS

(71) Applicant: Murata Manufacturing Co., Ltd., Nagaokakyo-shi, Kyoto-fu (JP)

(72) Inventors: Hajime Shiji, Nagaokakyo (JP); Yoshiyuki Uno, Nagaokakyo (JP); Yoshiaki Mizushima, Nagaokakyo (JP); Shouhei Hirose, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/568,432

(22) Filed: Sep. 12, 2019

(65) Prior Publication Data
US 2020/0007034 A1  Jan. 2, 2020

Related U.S. Application Data

(63) Continuation of application No. PCT/JP2018/010978, filed on Mar. 20, 2018.

(30) Foreign Application Priority Data

Mar. 31, 2017 (JP) .................................. 2017-071761
May 1, 2017 (JP) .................................. 2017-091063

(51) Int. Cl.
*H02M 3/157* (2006.01)
*H02M 3/156* (2006.01)
(Continued)

(52) U.S. Cl.
CPC .......... *H02M 3/156* (2013.01); *G01R 19/257* (2013.01); *H02M 1/096* (2013.01); *H02M 3/157* (2013.01); *H02M 3/158* (2013.01)

(58) Field of Classification Search
CPC ...... H02M 3/156; H02M 1/096; H02M 3/158; H02M 3/157; G01R 19/257
(Continued)

(56) References Cited

U.S. PATENT DOCUMENTS 5,563,479 A * 10/1996 Suzuki ................ H02M 3/1582
                                                        318/139
8,653,783 B2 * 2/2014 Ohashi ................ H02M 3/1582
                                                        219/622
(Continued)

FOREIGN PATENT DOCUMENTS

EP  3 048 712 A2  7/2016
JP  2012-130136 A  7/2012
JP  2016-140118 A  8/2016

OTHER PUBLICATIONS

Official Communication issued in International Patent Application No. PCT/JP2018/010978, dated Apr. 24, 2018.

*Primary Examiner* — Nguyen Tran
*Assistant Examiner* — Demetries A Gibson
(74) *Attorney, Agent, or Firm* — Keating & Bennett, LLP

(57) ABSTRACT

An abnormality determiner turns OFF a third switch and controls a converter controller to stop operating in a case where a voltage value detected by a voltage detector during a normal mode exceeds a first threshold value. The abnormality determiner determines that a first switch has an abnormality in a case where the voltage value exceeds a second threshold value in a state where the converter controller is stopped. The abnormality determiner controls the converter controller to operate in a case where the voltage value is equal to or smaller than the second threshold value in a state where the converter controller is stopped. The abnormality determiner determines that the converter controller has an abnormality in a case where the voltage value exceeds a third threshold value in a state where the converter controller is operated.

16 Claims, 5 Drawing Sheets

(51) Int. Cl.
*G01R 19/257* (2006.01)
*H02M 1/096* (2006.01)
*H02M 3/158* (2006.01)

(58) Field of Classification Search
USPC .......................................... 323/271, 282–285
See application file for complete search history.

(56) References Cited

U.S. PATENT DOCUMENTS

| | | | |
|---|---|---|---|
| 2011/0181261 A1* | 7/2011 | Kalechshtein ........... | H02M 1/34 323/284 |
| 2013/0181729 A1* | 7/2013 | Egan ....................... | G01R 31/40 324/750.01 |
| 2016/0105112 A1* | 4/2016 | Ukegawa ............. | H02H 7/1213 323/271 |
| 2017/0113567 A1* | 4/2017 | Koketsu ................ | B60L 15/007 |

* cited by examiner

POWER SUPPLY APPARATUS

CROSS REFERENCE TO RELATED APPLICATIONS

This application claims the benefit of priority to Japanese Patent Application No. 2017-071761 filed on Mar. 31, 2017 and Japanese Patent Application No. 2017-091063 filed on May 1, 2017, and is a Continuation Application of PCT Application No. PCT/JP2018/010978 filed on Mar. 20, 2018. The entire contents of each application are hereby incorporated herein by reference.

BACKGROUND OF THE INVENTION

1. Field of the Invention

The present invention relates to a power supply apparatus that increases or decreases a direct-current (DC) voltage.

2. Description of the Related Art

There has been known a technique of determining an abnormality that has occurred in a power supply apparatus of a DC-DC converter connected to a DC power supply.

Japanese Unexamined Patent Application Publication No. 2016-140118 discloses an abnormality determination method for a power supply apparatus including a first switching element and a second switching element that are sequentially connected in series to each other between a first DC power supply and ground, an inductor and a capacitor that are sequentially connected in series to each other between a node between the first switching element and the second switching element and the ground, and a third switching element that is connected between a node between the inductor and the capacitor and a second DC power supply.

Specifically, in a case where the voltage value at a node between the inductor and the third switching element is larger than or equal to a first threshold value during a normal operation, a control state of turning OFF the third switching element and turning ON/OFF the first switching element and the second switching element is executed. In this control state, in a case where the voltage value at the node between the inductor and the third switching element is larger than a second threshold value, a determination is made that there is an abnormality on the first DC power supply side viewed from the third switching element.

In a case where a determination is made that there is an abnormality on the first DC power supply side viewed from the third switching element, a control state of turning OFF the first to third switching elements is executed. In this control state, in a case where the voltage at the node between the inductor and the third switching element is larger than or equal to a third threshold value, a determination is made that the first switching element has an abnormality. In a case where the voltage at the node between the inductor and the third switching element is smaller than the third threshold value, a determination is made that a control system has an abnormality.

However, the technique described in Japanese Unexamined Patent Application Publication No. 2016-140118 involves the following issue. In a case where the voltage at the node between the inductor and the third switching element is larger than or equal to the first threshold value during a normal operation, the control state of turning OFF the third switching element and turning ON/OFF the first switching element and the second switching element is executed. At this time, in a case where the first switching element has a short-circuit breakage, it may cause a breakdown of the second switching element. That is, the number of broken components may increase.

SUMMARY OF THE INVENTION

Preferred embodiments of the present invention provide power supply apparatuses that are each able to determine an abnormality without increasing the number of broken components.

A power supply apparatus according to a preferred embodiment of the present invention includes a first connection portion to which a first DC power supply is connected; a second connection portion to which a second DC power supply is connected; a first switch and a second switch that are sequentially connected in series to each other between the first connection portion and ground; an inductor and a capacitor that are sequentially connected in series to each other between a node between the first switch and the second switch and the ground; a third switch that is connected between a node between the inductor and the capacitor and the second connection portion; a voltage detector that detects a voltage value at the node between the inductor and the capacitor; a converter controller that controls ON and OFF states of the first switch and the second switch so that the voltage value detected by the voltage detector approaches a target value; and an abnormality determiner that switches a state mode of each of the converter controller and the third switch to any one of a normal mode, a first abnormality determination mode, and a second abnormality determination mode, and that determines an abnormality in accordance with the voltage detected by the voltage detector. The normal mode is a state mode in which the converter controller operates and the third switch is in an ON state. The first abnormality determination mode is a state mode in which the converter controller stops operating, the first switch and the second switch are in an OFF state, and the third switch is in an OFF state. The second abnormality determination mode is a state mode in which the converter controller operates and the third switch is in an OFF state. The abnormality determiner switches the state mode from the normal mode to the first abnormality determination mode in a case where the voltage value detected by the voltage detector during the normal mode exceeds a first threshold value, and determines that the first switch has an abnormality in a case where the voltage value detected by the voltage detector during the first abnormality determination mode exceeds a second threshold value. The abnormality determiner switches the state mode from the first abnormality determination mode to the second abnormality determination mode in a case where the voltage value detected by the voltage detector during the first abnormality determination mode is equal to or smaller than the second threshold value, and determines that the converter controller has an abnormality in a case where the voltage value detected by the voltage detector during the second abnormality determination mode exceeds a third threshold value.

Preferably, the third switch is a MOSFET. A cathode of a body diode of the MOSFET is connected to the node between the inductor and the capacitor. An anode of the body diode of the MOSFET is connected to the second connection portion.

Preferably, the third switch includes two MOSFETs that are connected in series to each other, and directions of body diodes of the MOSFETs are preferably opposite to each other.

Preferably, the third switch is a bidirectional switching element.

Preferably, the power supply apparatus further includes a nonvolatile storage that stores a determination result of the abnormality determiner. In a case where the nonvolatile storage stores a determination result indicating that there is an abnormality, the abnormality determiner controls the converter controller to stop operating to turn OFF the first switch and the second switch, and turns OFF the third switch.

The power supply apparatuses according to preferred embodiments of the present invention are each able to determine an abnormality without increasing the number of broken components.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
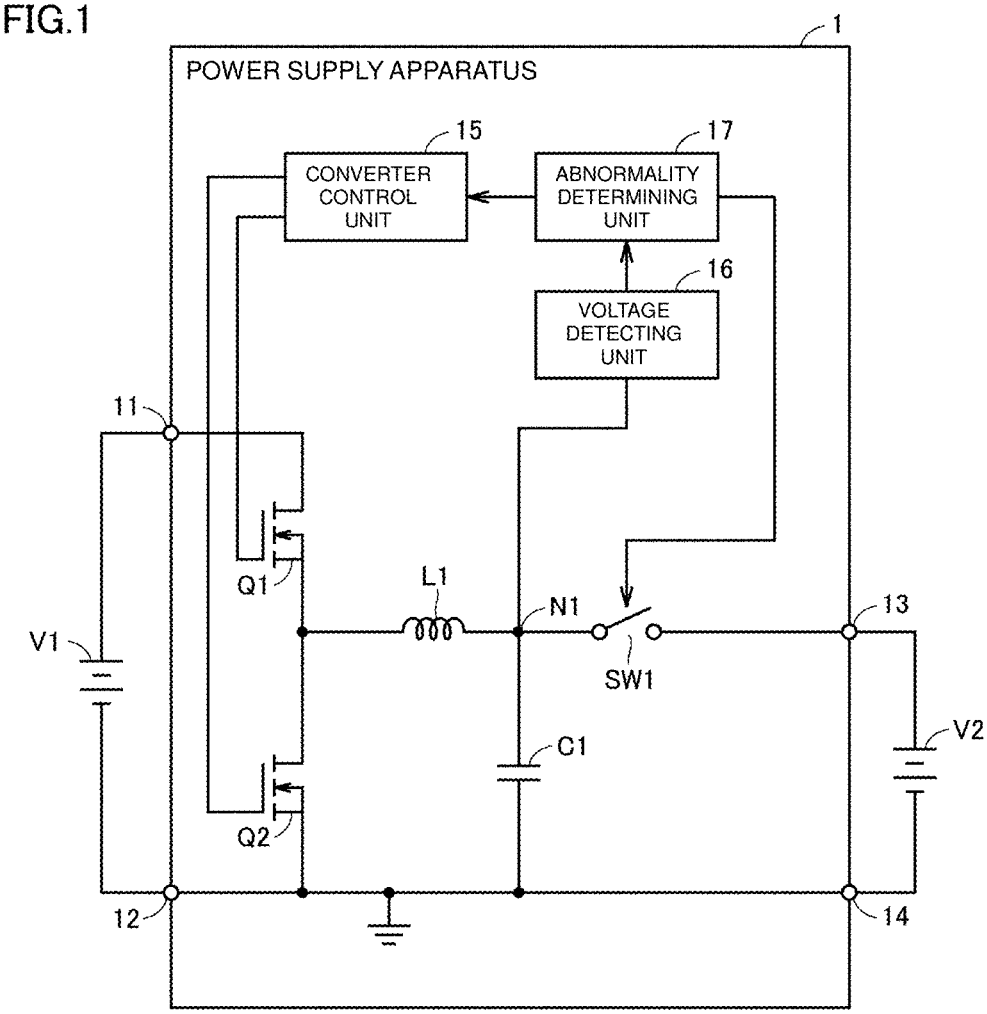
FIG. 1 is a circuit block diagram of a power supply apparatus according to a first preferred embodiment of the present invention.

Preferred embodiments of the present invention will be described in detail with reference to the drawings. In the figures, portions that are the same as or corresponding to each other are denoted by the same reference numerals, and the description thereof will not be repeated. The preferred embodiments or modification examples described below may be combined appropriately and selectively.

First Preferred Embodiment (Power Supply Apparatus)

FIG. 1 is a circuit block diagram of a power supply apparatus 1 according to a first preferred embodiment of the present invention. As illustrated in FIG. 1, the power supply apparatus 1 includes external connection terminals 11 to 14, a first switch Q1, a second switch Q2, an inductor L1, a capacitor C1, a third switch SW1, a converter controller 15, a voltage detector 16, and an abnormality determiner 17.

A DC power supply V1 is connected to the external connection terminals 11 and 12. A DC power supply V2 is connected to the external connection terminals 13 and 14. The external connection terminals 12 and 14 are connected to ground. The DC power supply V1 provides a higher voltage than the DC power supply V2.

In the case of outputting, from the external connection terminals 13 and 14, the power received at the external connection terminals 11 and 12, the power supply apparatus 1 functions as and defines a step-down converter that decreases the DC voltage applied to the external connection terminals 11 and 12. At this time, the topology of the converter included in the power supply apparatus 1 is a synchronous rectifying step-down chopper circuit, and the power supply apparatus 1 outputs a DC voltage that is lower than a DC voltage input thereto. On the other hand, in the case of outputting, from the external connection terminals 11 and 12, the power received at the external connection terminals 13 and 14, the power supply apparatus 1 functions as and defines a step-up converter that increases the DC voltage applied to the external connection terminals 13 and 14. At this time, the topology of the converter included in the power supply apparatus 1 is a synchronous rectifying step-up chopper circuit, and the power supply apparatus 1 outputs a DC voltage that is higher than a DC voltage input thereto. In this way, the power supply apparatus 1 is able to bi-directionally transmit power.

The first switch Q1 and the second switch Q2 are sequentially connected in series to each other between the external connection terminals 11 and 12. The first switch Q1 and the second switch Q2 are each preferably an n-channel metal-oxide-semiconductor field-effect transistor (MOSFET), for example. The second switch Q2 may be a diode. In this case, the cathode of the diode is connected to the first switch Q1.

The inductor L1 and the capacitor C1 are sequentially connected in series to each other between a node between the first switch Q1 and the second switch Q2 and the ground.

A node N1 between the inductor L1 and the capacitor C1 is connected to the external connection terminal 13 with the third switch SW1 provided therebetween. The third switch SW1 is preferably, for example, a MOSFET or the like. As will be described below, the third switch SW1 is in an ON state when the voltage value at the node N1 between the inductor L1 and the capacitor C1 is within a normal range, and is in an OFF state when the voltage value at the node N1 between the inductor L1 and the capacitor C1 is abnormally large. Thus, the third switch SW1 functions as and defines a protection switch that prevents an overvoltage from being applied to the external connection terminals 13 and 14.

Furthermore, the third switch SW1 is in an OFF state at the time of connecting the DC power supply V2 to the external connection terminals 13 and 14. This is to prevent a situation from occurring where an excessive short current flows when the DC power supply V2 with a reversed polarity is connected to the external connection terminals 13 and 14, resulting in breakdown of the power supply apparatus 1.

The converter controller 15 controls the ON and OFF states of the first switch Q1 and the second switch Q2, and performs a step-down converter operation of decreasing the DC voltage input to the external connection terminals 11 and 12 or a step-up converter operation of increasing the DC voltage input to the external connection terminals 13 and 14. In a case where the second switch Q2 is a diode, the converter controller 15 controls the ON and OFF states of only the first switch Q1. The converter controller 15 determines a duty period of the ON state in the first switch Q1 and the second switch Q2, and controls the ON and OFF states of the first switch Q1 and the second switch Q2 in accordance with the determined duty period.

The converter controller 15 receives a voltage value Vs at the node N1 from the voltage detector 16. The converter controller 15 performs, during a step-down converter operation, feedback control of controlling the ON and OFF states of the first switch Q1 and the second switch Q2 so that the voltage value Vs received from the voltage detector 16 converges to a target value.

The voltage detector 16 detects the voltage value Vs at the node N1. The voltage value Vs at the node N1 is a voltage value of a DC voltage provided by a step-down converter operation during the step-down converter operation. The voltage detector 16 outputs the detected voltage value Vs to the converter controller 15 and the abnormality determiner 17.

The abnormality determiner 17 determines an abnormality of the voltage value Vs at the node N1. Possible causes of an abnormality of the voltage value Vs include, for example, a surge abnormality of the DC power supply V2, a short-circuit breakage of the first switch Q1, and an abnormality of feedback control in the converter controller 15.

A surge abnormality of the DC power supply V2 is a phenomenon in which an abnormally high voltage occurs instantaneously at the DC power supply V2. A surge abnormality of the DC power supply V2 may occur in accordance with the state of a load or power generator connected to the DC power supply V2 or the inductance of a line that connects the external connection terminals 13 and 14 to the DC power supply V2. The occurrence of a surge abnormality of the DC power supply V2 causes the voltage value Vs at the node N1 to instantaneously become abnormally high through the external connection terminal 13 and the third switch SW1. The surge abnormality of the DC power supply V2 is instantaneous, and then the voltage value of the DC power supply V2 converges to a value within a normal voltage range.

A short-circuit breakage of the first switch Q1 is a phenomenon in which the first switch Q1 breaks down and is constantly in a conduction state. When a short-circuit breakage of the first switch Q1 occurs, the voltage value Vs at the node N1 becomes abnormally high to reach the voltage value of the DC power supply V1.

An abnormality of feedback control in the converter controller 15 is a phenomenon in which, when the converter controller 15 performs a step-down converter operation, the ON and OFF states of the first switch Q1 and the second switch Q2 are not normally controlled, and the voltage value Vs at the node N1 becomes abnormally higher than a target value. For example, an abnormality of feedback control occurs when the difference between the target value and the voltage value Vs is determined significantly wrongly with respect to an actual value for some reasons, and the converter controller 15 increases the ON period of the first switch Q1 to a maximum or substantially maximum value.

The abnormality determiner 17 switches the state mode of each of the converter controller 15 and the third switch SW1 to any one of a normal mode, a first abnormality determination mode, and a second abnormality determination mode.

The normal mode is a state mode in which the converter controller 15 operates and the third switch SW1 is in an ON state. When performing a step-down converter operation in the normal mode, the converter controller 15 performs feedback control.

The first abnormality determination mode is a state mode in which the converter controller 15 stops operating, the first switch Q1 and the second switch Q2 are in an OFF state, and the third switch SW1 is in an OFF state.

The second abnormality determination mode is a state mode in which the converter controller 15 operates and the third switch SW1 is in an OFF state. In the second abnormality determination mode, the converter controller 15 performs feedback control.

The abnormality determiner 17 switches the state mode from the normal mode to the first abnormality determination mode in a case where the voltage value Vs detected by the voltage detector 16 during the normal mode exceeds a first threshold value Vth1. The first threshold value is a value that is smaller than a possible minimum voltage value at the node N1 when any one of a surge abnormality of the DC power supply V2, a short-circuit breakage of the first switch Q1, and a feedback abnormality in the converter controller 15 occurs, and that is larger than a possible maximum voltage value at the node N1 when the power supply apparatus 1 is in a normal state. The first threshold value Vth1 is set in advance.

The abnormality determiner 17 determines that the first switch Q1 has an abnormality (that is, a short-circuit breakage has occurred in the first switch Q1) in a case where the voltage value Vs detected by the voltage detector 16 during the first abnormality determination mode exceeds a second threshold value Vth2. The second threshold value Vth2 is a value that is smaller than a possible minimum voltage value at the node N1 when a short-circuit breakage of the first switch Q1 occurs, and that is larger than a possible maximum voltage value at the node N1 when the power supply apparatus 1 is in the normal state. The second threshold value Vth2 is set in advance.

The abnormality determiner 17 switches the state mode from the first abnormality determination mode to the second abnormality determination mode in a case where the voltage value Vs detected by the voltage detector 16 during the first abnormality determination mode is equal to or smaller than the second threshold value Vth2.

The abnormality determiner 17 determines that the converter controller 15 has an abnormality (that is, an abnormality of feedback control has occurred) in a case where the voltage value Vs detected by the voltage detector 16 during the second abnormality determination mode exceeds a third threshold value Vth3. The third threshold value Vth3 is a value that is smaller than a possible minimum voltage value at the node N1 when an abnormality of feedback control occurs in the feedback control unit 15, and that is larger than a possible maximum voltage value at the node N1 when the power supply apparatus 1 is in the normal state. The third threshold value Vth3 is set in advance.

The abnormality determiner 17 determines that the voltage value Vs is instantaneously large due to a surge abnormality of the DC power supply V2, in a case where the voltage value Vs detected by the voltage detector 16 during the second abnormality determination mode is smaller than or equal to the third threshold value Vth3.

The first threshold value Vth1, the second threshold value Vth2, and the third threshold value Vth3 may be the same or substantially the same as or different from each other. For example, in a case where the DC power supply V1 is a 48-V battery and the DC power supply V2 is a 12-V battery, the first threshold value Vth1, the second threshold value Vth2, and the third threshold value Vth3 are each set to, for example, about 27 V. In a case where the DC power supply V1 is a 48-V battery, a voltage of about 30 V to about 50 V is applied to the external connection terminals 11 and 12, considering fluctuations of the output voltage of the battery. On the other hand, in a case where the DC Power supply V2 is a 12-V battery, a voltage of about 10 V to about 16 V is applied to the external connection terminals 13 and 14, considering fluctuations of the output voltage of the battery. In a case where the power supply apparatus 1 is normally performing a step-down converter operation, the DC voltage applied to the external connection terminals 11 and 12 is decreased to be similar to the DC voltage applied to the external connection terminals 13 and 14. That is, the voltage value at the node N1 between the inductor L1 and the capacitor C1 becomes about 10 V to about 16 V. Thus, as a result of setting the first threshold value Vth1, the second threshold value Vth2, and the third threshold value Vth3 to about 27 V, an abnormality of the voltage value Vs at the node N1 is able to be determined.

(Flow of Process in Power Supply Apparatus)

Figure 2:
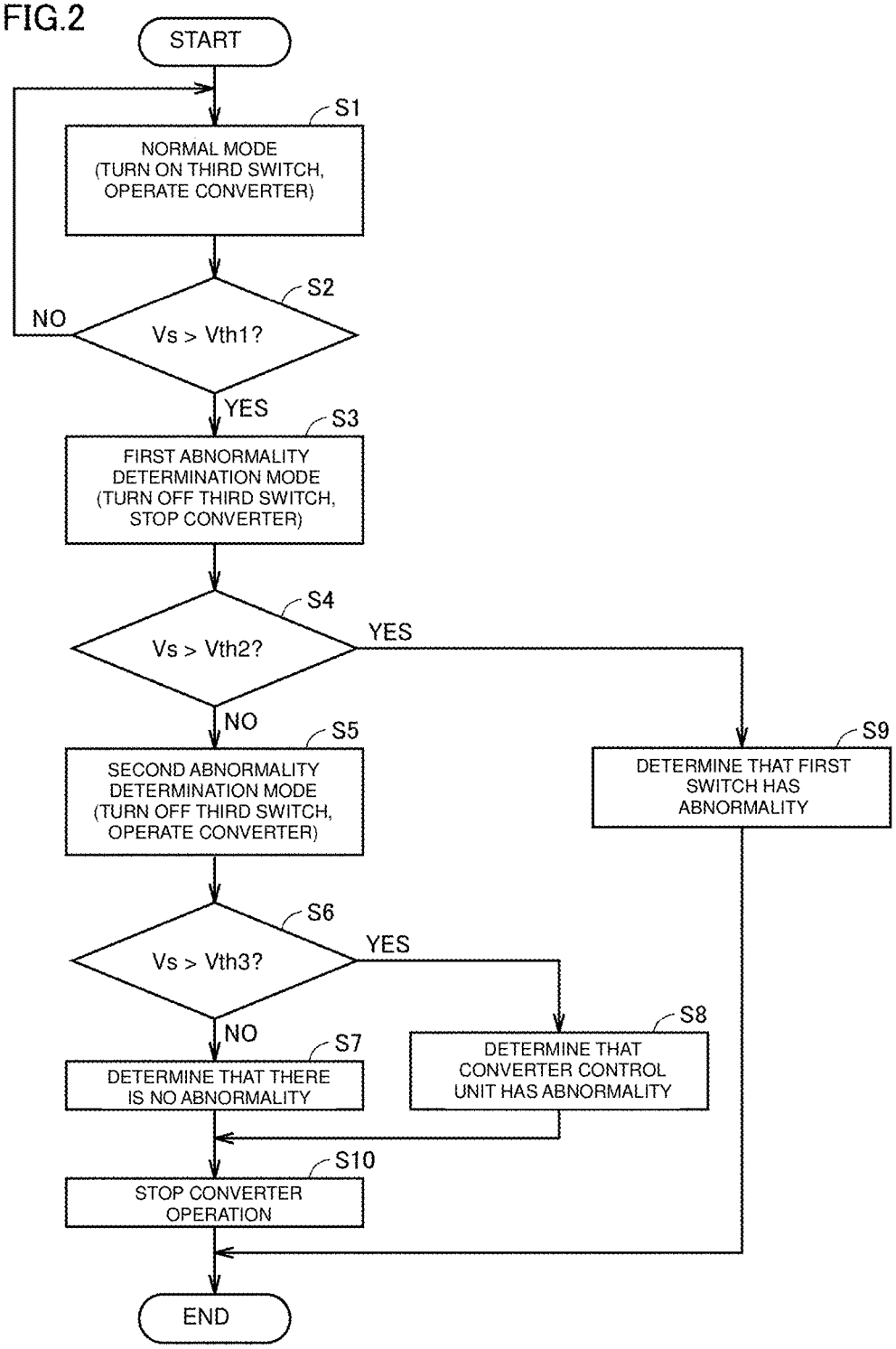
FIG. 2 is a flowchart illustrating a flow of an abnormality determination process in the power supply apparatus according to the first preferred embodiment of the present invention.

A flow of an abnormality determination process in the power supply apparatus 1 will be described with reference to FIG. 2. FIG. 2 is a flowchart illustrating the flow of the abnormality determination process in the power supply apparatus 1.

First, the abnormality determiner 17 sets the state mode of each of the converter controller 15 and the third switch SW1 to the normal mode (step S1). That is, the third switch SW1 enters an ON state, and the first switch Q1 and the second switch Q2 are ON/OFF-controlled.

Subsequently, the abnormality determiner 17 compares the first threshold value Vth1 with the voltage value Vs detected by the voltage detector 16 after a predetermined period of time (for example, about 10 ms) elapses from step S1, and determines whether or not Vs>Vth1 is satisfied (step S2).

In a case where Vs≤Vth1 (NO in S2), the abnormality determination process returns to step S1. In a case where Vs>Vth1 (YES in S2), the abnormality determiner 17 switches the state mode of each of the converter controller 15 and the third switch SW1 from the normal mode to the first abnormality determination mode (step S3). That is, the first switch Q1, the second switch Q2, and the third switch SW1 enter an OFF state.

Subsequently, the abnormality determiner 17 compares the second threshold value Vth2 with the voltage value Vs detected by the voltage detector 16 after a predetermined period of time elapses from step S3, and determines whether or not Vs>Vth2 is satisfied (step S4). The reason for waiting until the predetermined period of time elapses from the switching from the normal mode to the first abnormality determination mode is to release electric charges accumulated at the node N1 during the normal mode. Here, the predetermined period of time is appropriately set in accordance with the circuitry of the power supply apparatus 1, and is, for example, a few seconds (about 2 to about 3 seconds).

Here, in a case where a short-circuit breakage has occurred in the first switch Q1, the voltage value Vs at the node N1 increases to the voltage value of the DC power supply V1. Thus, in a case where Vs>Vth2 is satisfied (YES in S4), the abnormality determiner 17 determines that the first switch Q1 has an abnormality (step S9). After step S9, the abnormality determination process ends.

On the other hand, in a case where Vs Vth2 (NO in S4), the abnormality determiner 17 switches the state mode of each of the converter controller 15 and the third switch SW1 from the first abnormality determination mode to the second abnormality determination mode (step S5). That is, the third switch SW1 enters an OFF state, and the first switch Q1 and the second switch Q2 are ON/OFF-controlled.

Subsequently, the abnormality determiner 17 compares the third threshold value Vth3 with the voltage value Vs detected by the voltage detector 16 after a predetermined period of time elapses from step S5, and determines whether or not Vs>Vth3 is satisfied (step S6). The reason for waiting until the predetermined period of time elapses from the switching from the first abnormality determination mode to the second abnormality determination mode is to release electric charges accumulated at the node N1 during the first abnormality determination mode. Here, the predetermined period of time is appropriately set in accordance with the circuitry of the power supply apparatus 1, and is, for example, a few seconds (about 2 to about 3 seconds).

Here, in a case where an abnormality of feedback control has occurred in the converter controller 15, the voltage value Vs at the node N1 during a step-down converter operation becomes abnormally large. Thus, in a case where Vs>Vth3 is satisfied (YES in S6), the abnormality determiner 17 determines that the converter controller 15 has an abnormality (step S8).

On the other hand, in a case where Vs≤Vth3 (NO in S6), the abnormality determiner 17 determines that the state Vs>Vth1 determined in step S2 is temporal and is resulting from a surge abnormality in the DC power supply V2, and determines that there is no abnormality at present (step S7).

After step S7 or S8, the abnormality determiner 17 switches the state mode of each of the converter controller 15 and the third switch SW1 from the second abnormality determination mode to the first abnormality determination mode, and stops the converter operation in the power supply apparatus 1 (step S10). After step S10, the abnormality determination process ends.

The power supply apparatus 1 restarts in response to a restart instruction after step S10. At this time, in a case where it is determined in step S2 that Vs>Vth1 and it is determined in step S7 that there is no abnormality in the previous abnormality determination process, the previous abnormality is temporary, and thus the power supply apparatus 1 is able to normally restart the converter operation. On the other hand, in a case where it is determined in the previous abnormality determination process that the converter controller 15 or the first switch Q1 has an abnormality, the power supply apparatus 1 stops the converter operation again in step S10 unless maintenance, such as repairing, is performed.

As described above, the abnormality determiner 17 switches the state mode from the normal mode to the first abnormality determination mode in a case where the voltage value Vs detected by the voltage detector 16 during the normal mode exceeds the first threshold value Vth1. That is, the abnormality determiner 17 turns OFF the third switch SW1 and stops the converter controller 15. The abnormality determiner 17 determines that the first switch Q1 has an abnormality in a case where the voltage value Vs exceeds the second threshold value Vth2 during the first abnormality determination mode. The abnormality determiner 17 switches the state mode from the first abnormality determination mode to the second abnormality determination mode in a case where the voltage value Vs is equal to or smaller than the second threshold value Vth2 during the first abnormality determination mode. That is, the abnormality determiner 17 turns OFF the third switch SW1 and operates the converter controller 15. The abnormality determiner 17 determines that the converter controller 15 has an abnormality in a case where the voltage value Vs exceeds the third threshold value Vth3 during the second abnormality determination mode.

As described above, in a case where the voltage value Vs exceeds the first threshold value Vth1 during the normal mode, the third switch SW1 is turned OFF and the operation of the converter controller 15 is stopped. In this state, whether or not the first switch Q1 has an abnormality is determined. Subsequently, after a determination is made that the first switch Q1 does not have an abnormality, the converter controller 15 is operated, and whether or not the converter controller 15 has an abnormality is determined. Thus, the converter controller 15 does not operate in a state where the first switch Q1 has a short-circuit breakage. As a result, breakdown of the second switch Q2 resulting from the short-circuit breakage of the first switch Q1 is able to be significantly reduced or prevented. Accordingly, an abnormality determination is able to be performed without increasing the number of broken components.

(Example 1 of Power Supply Apparatus)

Next, a specific example of the power supply apparatus 1 according to the first preferred embodiment will be described. The power supply apparatus 1 is applied to a system equipped with the two DC power supplies V1 and V2 different from each other. For example, the power supply apparatus 1 is able to be applied to a vehicle system or the like, for example, including a 48-V battery which is a lithium ion battery as the DC power supply V1 and including a 12-V battery which is a lead battery as the DC power supply V2.

Figure 3:
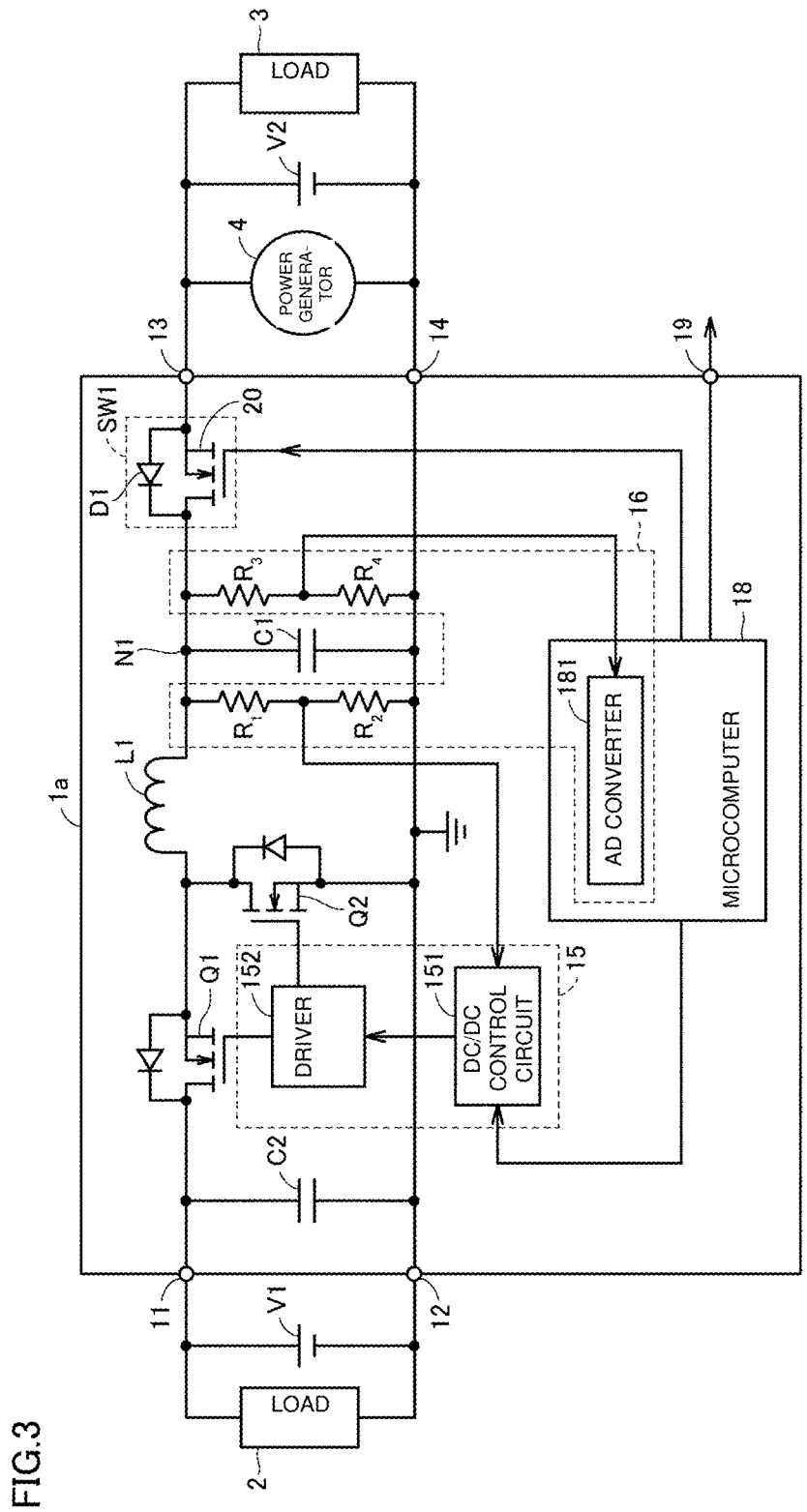
FIG. 3 is a circuit diagram illustrating a power supply apparatus according to an Example 1 of the first preferred embodiment of the present invention.

FIG. 3 is a circuit diagram illustrating a power supply apparatus 1a according to an Example 1 of the first preferred embodiment. As illustrated in FIG. 3, the power supply apparatus 1a includes the external connection terminals 11 to 14, a communication port 19, the first switch Q1, the second switch Q2, an n-channel MOSFET 20, the inductor L1, capacitors C1 and C2, resistors R1 to R4, a DC/DC control circuit 151, a driver 152, and a microcomputer 18.

In addition to the DC power supply V1 which is a lithium ion battery, a load 2 is connected to the external connection terminals 11 and 12. The load 2 is driven by the voltage of the DC power supply V1. On the other hand, in addition to the DC power supply V2 which is a lead battery, a load 3 and a power generator 4 are connected to the external connection terminals 13 and 14. The load 3 is driven by the voltage of the DC power supply V2. The power generator 4 is, for example, an alternator.

In a case where the DC power supply V2 is in a low charge state, the power supply apparatus 1a charges the DC power supply V2 with a DC voltage provided by decreasing a DC voltage received from the DC power supply V1. On the other hand, in a case where the DC power supply V1 is in a low charge state, the power supply apparatus 1a charges the DC power supply V1 with a DC voltage provided by increasing a DC voltage received from the power generator 4 and the DC power supply V2.

The n-channel MOSFET 20 is a switching element that functions as and defines the third switch SW1. The drain terminal of the n-channel MOSFET 20 is connected to the node N1 between the inductor L1 and the capacitor C1. The source terminal of the re-channel MOSFET 20 is connected to the external connection terminal 13. At this time, the cathode of a body diode D1 of the n-channel MOSFET 20 is connected to the node N1, and the anode of the body diode D1 is connected to the external connection terminal 13. Accordingly, even in a case where the voltage value at the node N1 becomes abnormally large, turning OFF of the n-channel MOSFET 20 is able to prevent an abnormally high voltage from being output from the external connection terminals 13 and 14.

The capacitor C2 is connected between the external connection terminal 11 and the external connection terminal 12 and stabilizes the DC voltage input to the external connection terminals 11 and 12.

The resistors R1 and R2 are sequentially connected in series to each other between the node N1 and the ground, and divide the voltage at the node N1. Similarly, the resistors R3 and R4 are sequentially connected in series to each other between the node N1 and the ground, and divide the voltage at the node N1. A node between the resistor R1 and the resistor R2 is connected to the DC/DC control circuit 151. A node between the resistor R3 and the resistor R4 is connected to the microcomputer 18.

The DC/DC control circuit 151 and the driver 152 define the converter controller 15. The DC/DC control circuit 151 is, preferably, for example, an integrated circuit including a central processing unit (CPU), a read only memory (ROM), a random access memory (RAM), and an interface. The DC/DC control circuit 151 calculates the voltage value Vs at the node N1 according to the voltage value at the node between the resistor R1 and the resistor R2. That is, the resistor R1, the resistor R2, and a portion of the DC/DC control circuit 151 define the voltage detector 16. The DC/DC control circuit 151 calculates a difference voltage between the voltage value Vs and a designated target value. According to the calculated difference voltage, the DC/DC control circuit 151 calculates a duty period corresponding to the length of an ON period of each of the first switch Q1 and the second switch Q2. The DC/DC control circuit 151 calculates the duty period by using P control, PI control, or PID control. According to the calculated duty period, the DC/DC control circuit 151 outputs an instruction to the driver 152.

The DC/DC control circuit 151 calculates the duty period only while receiving an operation signal from the microcomputer 18. While receiving a stop signal from the microcomputer 18, the DC/DC control circuit 151 controls the ON period of each of the first switch Q1 and the second switch Q2 zero, and controls the first switch Q1 and the second switch Q2 to be in an OFF state.

The driver 152 is connected to the gate terminals of the first switch Q1 and the second switch Q2. The driver 152 generates a pulse signal in response to an instruction from the DC/DC control circuit 151 and outputs the generated pulse signal to the gate terminals of the first switch Q1 and the second switch Q2. Accordingly, the driver 152 performs ON/OFF control of the first switch Q1 and the second switch Q2.

The microcomputer 18 is a computer including a CPU, a ROM, a RAM, and an interface, for example. The microcomputer 18 includes an AD (analog-to-digital) converter 181 that performs analog-to-digital conversion. The AD converter 181 converts an analog value of a voltage at the node between the resistor R3 and the resistor R4 to the voltage value Vs, which is a digital value. The resistor R3, the resistor R4, and the AD converter 181 define the voltage detector 16.

The ROM of the microcomputer 18 stores, in advance, a program to perform the above-described process of the abnormality determiner 17. The CPU of the microcomputer 18 executes the program, thus functioning as and defining the abnormality determiner 17. The DC/DC control circuit 151 and the gate terminal of the n-channel MOSFET 20 are connected to the microcomputer 18. The microcomputer 18 outputs an operation signal or a stop signal to the DC/DC control circuit 151 in accordance with a state mode determined according to the voltage value Vs output by the AD converter 181. Furthermore, the microcomputer 18 outputs an ON signal or OFF signal to the gate terminal of the n-channel MOSFET 20 in accordance with the determined state mode.

The microcomputer 18 is connected to the communication port 19 and outputs data indicating a result of an abnormality determination process to an external apparatus through the communication port 19. Accordingly, a user is able to confirm the result of the abnormality determination process through the external apparatus and is able to perform an operation according to the result (for example, checking and replacement of any one of the first switch Q1, the DC/DC control circuit 151, and the driver 152).

(Example 2 of Power Supply Apparatus)

Figure 4:
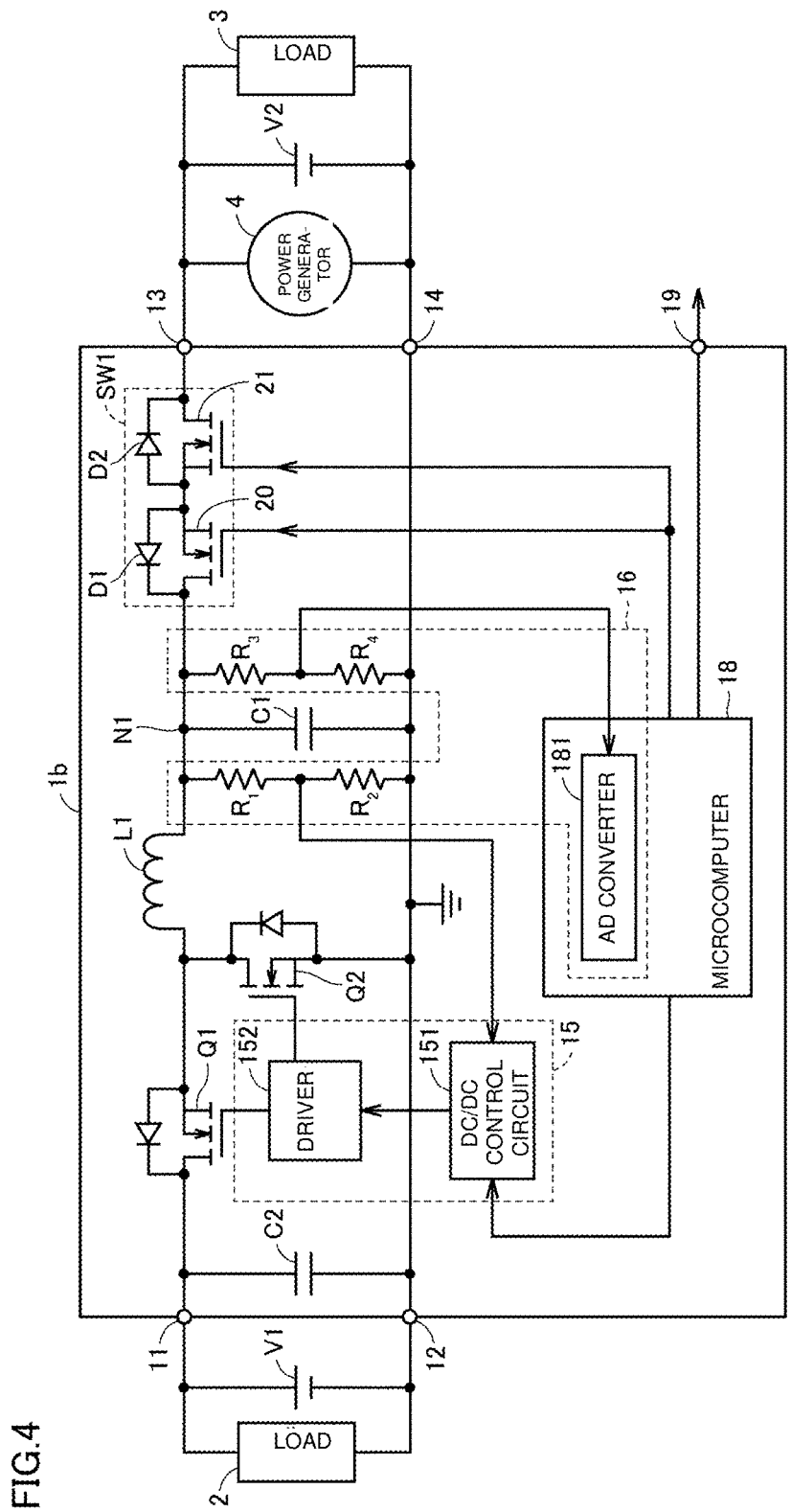
FIG. 4 is a circuit diagram illustrating a power supply apparatus according to an Example 2 of the first preferred embodiment of the present invention.

FIG. 4 is a circuit diagram illustrating a power supply apparatus 1b according to an Example 2 of the first preferred embodiment. As illustrated in FIG. 4, the power supply apparatus 1b is different from the power supply apparatus 1a according to the Example 1 only in including an n-channel MOSFET 21. In the power supply apparatus 1b according to the Example 2, the two n-channel MOSFETs 20 and 21 define the third switch SW1.

The n-channel MOSFET 21 is connected between the re-channel MOSFET 20 and the external connection terminal 13. The cathode of a body diode D2 of the n-channel MOSFET 21 is connected to the external connection terminal 13, and the anode of the body diode D2 is connected to the anode of the body diode D1 of the re-channel MOSFET 20. That is, the n-channel MOSFETs 20 and 21 are connected to each other, and the directions of the respective body diodes D1 and D2 are opposite to each other. With the directions of the body diodes D1 and D2 being opposite to each other, the current flowing from the external connection terminals 13 and 14 to the inductor L1 is able to be blocked even in a case where the voltage of the DC power supply V2 is higher than that of the DC power supply V1. Accordingly, even in a case where a steady overvoltage abnormality occurs in the DC power supply V2, the abnormality determiner 17 (see FIG. 1) defined by the microcomputer 18 is able to determine an abnormality in the first switch Q1 or the converter controller 15 without being affected by the steady overvoltage abnormality. The steady overvoltage abnormality occurs in the DC power supply V2, for example, when a battery with a voltage higher than a predetermined voltage (for example, 12 V) is connected to the external connection terminals 13 an 14 by mistake.

Furthermore, blocking of a current flowing from the external connection terminals 13 and 14 to the inductor L1 prevents a current from flowing to the second switch Q2 and significantly reduces or prevents element breakdown of the second switch Q2.

The third switch SW1 may be a bidirectional switching element that is able to provide bidirectional conduction and blockage. An insulated gate bipolar transistor (IGBT) in which a body diode is not provided, a GaN-FET which is a wideband gap semiconductor switch, a mechanical switch such as a relay, or the like may be used as a bidirectional switching element. In this case, the third switch SW1 is able to be a single element, and thus space saving is able to be achieved.

Second Preferred Embodiment

Figure 5:
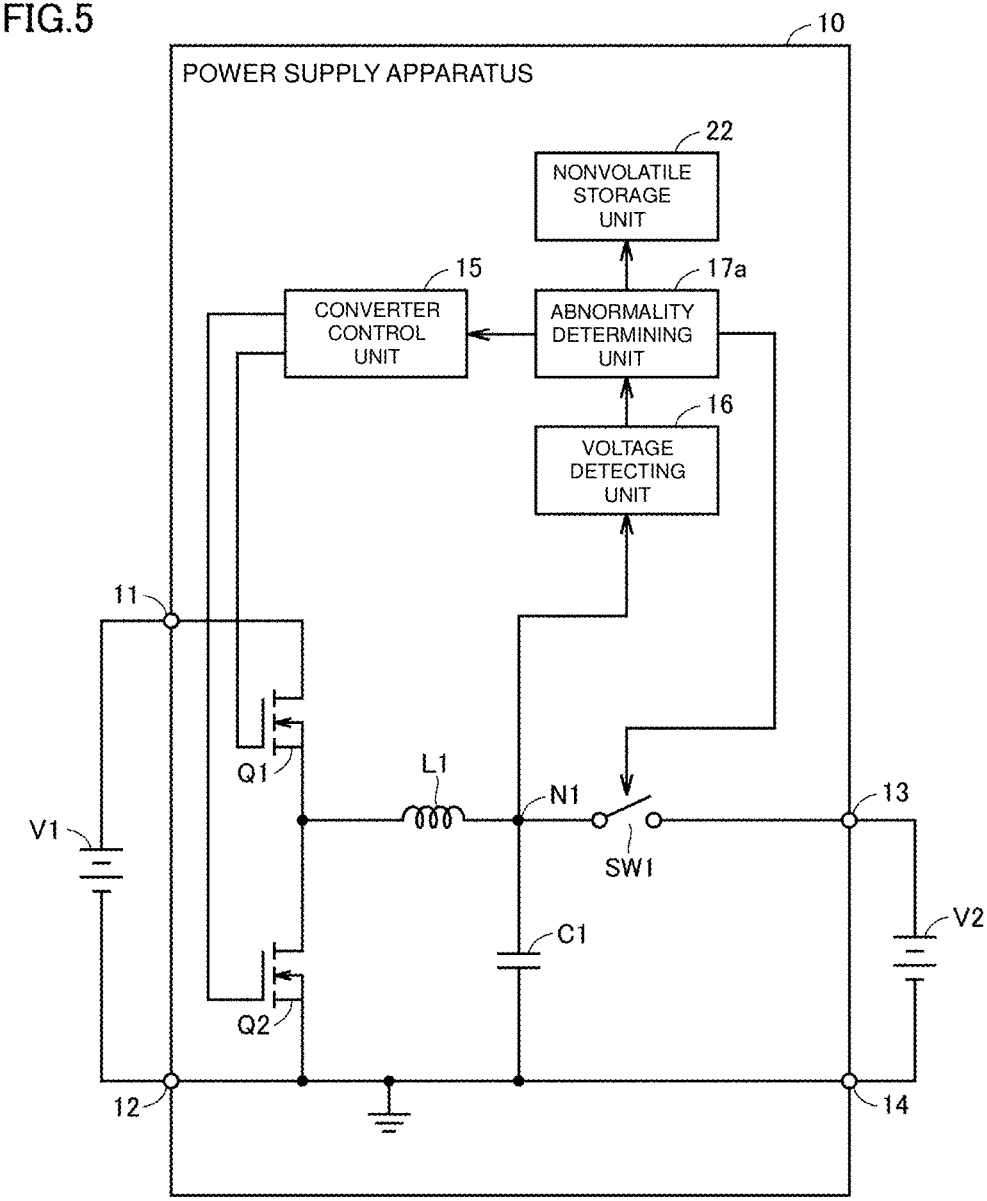
FIG. 5 is a circuit block diagram of a power supply apparatus according to a second preferred embodiment of the present invention.

A power supply apparatus 10 according to a second preferred embodiment of the present invention will be described with reference to FIG. 5. FIG. 5 is a circuit block diagram of the power supply apparatus 10 according to the second preferred embodiment.

As illustrated in FIG. 5, the power supply apparatus 10 is different from the power supply apparatus 1 illustrated in FIG. 1 in including a nonvolatile storage 22 and also including an abnormality determiner 17a. instead of the abnormality determiner 17. The other points are the same or substantially the same as those of the power supply apparatus 1 illustrated in FIG. 1 and thus the description thereof is not repeated.

The nonvolatile storage 22 is a memory that stores a latest determination result of the abnormality determiner 17a. The nonvolatile storage 22 may preferably be built in the microcomputer 18 illustrated in FIG. 3, for example.

The abnormality determiner 17a includes the following features in addition to the features of the abnormality determiner 17 according to the first preferred embodiment. In a case where the abnormality determiner 17a determines that the first switch Q1 has an abnormality (see step S9 in FIG. 2) and in a case where the abnormality determiner 17a determines that the converter controller 15 has an abnormality (see step S8 in FIG. 2), the abnormality determiner 17a stores a determination result indicating that there is an abnormality in the nonvolatile storage 22. In a case where the abnormality determiner 17a determines that there is no abnormality (see step S7 in FIG. 2), the abnormality determiner 17a stores a determination result indicating that there is no abnormality in the nonvolatile storage 22. In a case where the nonvolatile storage 22 already has a determination result stored therein when the abnormality determiner 17a performs any one of steps S7 to S9 illustrated in FIG. 2, the abnormality determiner 17a updates the determination result stored in the nonvolatile storage 22.

In a case where the nonvolatile storage 22 stores a determination result indicating that there is an abnormality, the abnormality determiner 17a controls the converter controller 15 to stop operating to turn OFF the first switch Q1 and the second switch Q2, and turns OFF the third switch SW1. Accordingly, even in a case where the power supply apparatus 10 is restarted after a determination result indicating that there is an abnormality is stored in the nonvolatile storage 22, it is possible to significantly reduce or prevent output of an overvoltage from the external connection terminals 13 and 14.

In a case where the nonvolatile storage 22 stores a determination result indicating that there is an abnormality, the abnormality determiner 17a performs steps S4 to S10 illustrated in FIG. 2 at predetermined timing. The predetermined timing is the timing at which a re-determination instruction is received from an upper-level control unit, the timing at which a predetermined period of time (for example, a few seconds (2 to 3 seconds)) elapses from when the power supply apparatus 10 is restarted, or the like. Accordingly, even in a case where a determination result indicating that there is an abnormality is stored in the nonvolatile storage 22 due to a wrong determination, the abnormality determiner 17a is able to determine again at the predetermined timing and updating the determination result stored in the nonvolatile storage 22 to a determination result indicating that there is no abnormality. As a result, the power supply apparatus 10 is able to be restarted. In a case where a touch of a conductor with the first switch Q1 results in a determination that the first switch Q1 has an abnormality, the abnormality determiner 17a is able to determine again at the predetermined timing after the conductor has been removed. As a result, the determination result stored in the nonvolatile storage 22 is updated to indicate that there is no abnormality, and the power supply apparatus 10 is able to restart.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply apparatus comprising:
a first connection portion to which a first DC power supply is connected;
a second connection portion to which a second DC power supply is connected;
a first switch and a second switch that are sequentially connected in series to each other between the first connection portion and ground;
an inductor and a capacitor that are sequentially connected in series to each other between a node between the first switch and the second switch and the ground;
a third switch that is connected between a node between the inductor and the capacitor and the second connection portion;
a voltage detector that detects a voltage value at the node between the inductor and the capacitor;
a converter controller that controls ON and OFF states of the first switch and the second switch so that the voltage value detected by the voltage detector approaches a target value; and
an abnormality determiner that switches a state mode of each of the converter controller and the third switch to any one of a normal mode, a first abnormality determination mode, and a second abnormality determination mode, and that determines an abnormality in accordance with the voltage value detected by the voltage detector; wherein
the normal mode is a first state mode in which the converter controller operates and the third switch is in an ON state;
the first abnormality determination mode is a first state mode in which the converter controller stops operating, the first switch and the second switch are in an OFF state, and the third switch is in an OFF state;
the second abnormality determination mode is a first state mode in which the converter controller operates and the third switch is in an OFF state; and
the abnormality determiner
switches the state mode from the normal mode to the first abnormality determination mode in a case where the voltage value detected by the voltage detector during the normal mode exceeds a first threshold value, determines that the first switch has an abnormality in a case where the voltage value detected by the voltage detector during the first abnormality determination mode exceeds a second threshold value, and
switches the state mode from the first abnormality determination mode to the second abnormality determination mode in a case where the voltage value detected by the voltage detector during the first abnormality determination mode is equal to or smaller than the second threshold value, and determines that the converter controller has an abnormality in a case where the voltage value detected by the voltage detector during the second abnormality determination mode exceeds a third threshold value.

2. The power supply apparatus according to claim 1, wherein
the third switch is a metal-oxide-semiconductor field-effect transistor (MOSFET);
a cathode of a body diode of the MOSFET is connected to the node between the inductor and the capacitor; and
an anode of the body diode of the MOSFET is connected to the second connection portion.

3. The power supply apparatus according to claim 1, wherein the third switch includes two MOSFETs that are connected in series to each other.

4. The power supply apparatus according to claim 3, wherein directions of body diodes of the MOSFETs are opposite to each other.

5. The power supply apparatus according to claim 1, wherein the third switch is a bidirectional switching element.

6. The power supply apparatus according to claim 1, further comprising:
a nonvolatile storage that stores a determination result of the abnormality determiner; wherein
in a case where the nonvolatile storage stores a determination result indicating that there is an abnormality, the abnormality determiner controls the converter controller to stop operating to turn OFF the first switch and the second switch, and to turn OFF the third switch.

7. The power supply apparatus according to claim 1, wherein at least one of the first connection portion and the second connection portion includes an external terminal.

8. The power supply apparatus according to claim 1, wherein the first DC power supply has a higher voltage than the second DC power supply.

9. The power supply apparatus according to claim 1, wherein
the first connection portion receives power supplied from the first DC power supply; and
the second connection portion outputs power to the second DC power supply.

10. The power supply apparatus according to claim 1, wherein
the first connection portion supplies power to the first DC power supply; and
the second connection portion receives power supplied from the second DC power supply.

11. The power supply apparatus according to claim 1, wherein at least one of the first switch and the second switch is a MOSFET.

12. The power supply apparatus according to claim 1, wherein at least two of the first threshold value, the second threshold value, and the third threshold value are equal or substantially equal to each other.

13. An electrical supply system, comprising:
the power supply apparatus according to claim 1;
a first load that is connected to the first connection portion; and
a second load that is connected to the second connection portion.

14. The electrical supply system according to claim 13, further comprising an alternator connected to the second connection portion.

15. The power supply apparatus according to claim 1, wherein the voltage detector is defined by a first resistor, a second resistor, and an AD (analog-to-digital) converter.

16. The power supply apparatus according to claim 1, wherein the abnormality determiner includes a communication port that outputs data of a determination result.

* * * * *